United States Patent [19]

Harrison

[11] 4,056,783

[45] Nov. 1, 1977

[54] LINEAR SOUND AMPLIFIER CIRCUIT

[75] Inventor: Stanley Norman Harrison, Dupont, Colo.

[73] Assignee: AudioKinetics Corporation, Denver, Colo.

[21] Appl. No.: 765,117

[22] Filed: Feb. 3, 1977

Related U.S. Application Data

[63] Continuation of Ser. No. 640,329, Dec. 12, 1975, abandoned.

[51] Int. Cl.² .............................................. H03F 3/18
[52] U.S. Cl. ................................... 330/268; 330/266; 330/295; 330/143
[58] Field of Search ....................... 330/13, 15, 17, 18, 330/23

[56] References Cited

U.S. PATENT DOCUMENTS 3,195,065   7/1965   Grant .................................. 330/23 X
3,258,704   6/1966   Wittman ............................. 330/18 X

FOREIGN PATENT DOCUMENTS 1,162,274   9/1958   France ............................. 330/118 X Primary Examiner—Lawrence J. Dahl
Attorney, Agent, or Firm—John E. Reilly

[57] ABSTRACT

A Class AB linear power amplifier circuit is connected in a balanced bridge configuration for increasing the fidelity and power output from stereophonic sound systems, such as used primarily in automotive vehicles, the circuitry consisting of a series of NPN transistors and PNP transistors, with bias for the transistors provided by a power source, a series of resistors and thermistors, an optional input overload protection circuit, with the transistors further being matched and balanced so as to effectively double or quadruple output power as would be available from a single ended configuration, so that the amplifier circuitry operates in a Class A mode to eliminate any crossover distortion.

3 Claims, 2 Drawing Figures

U.S. Patent  Nov. 1, 1977  4,056,783
FIG_1_
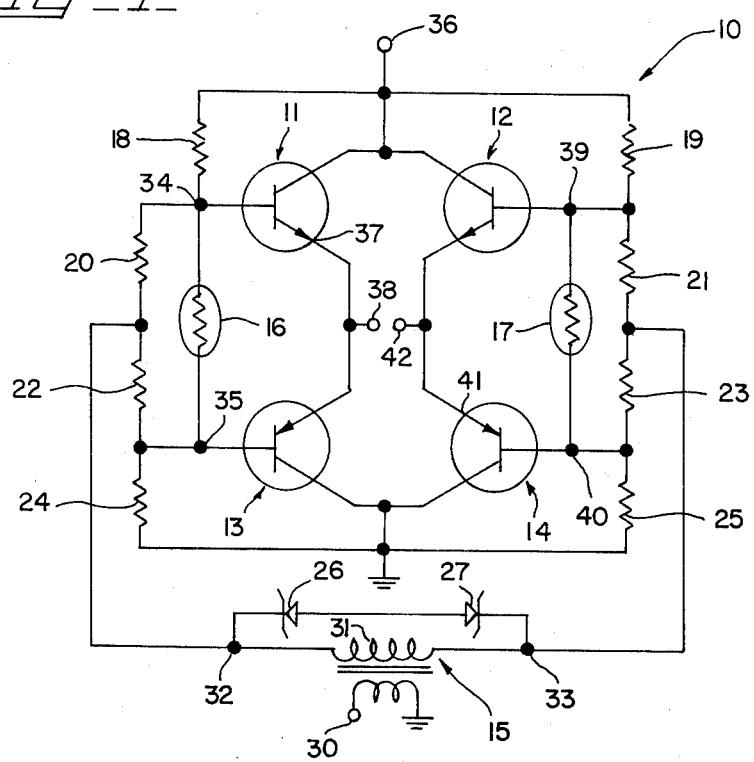
FIG_2_
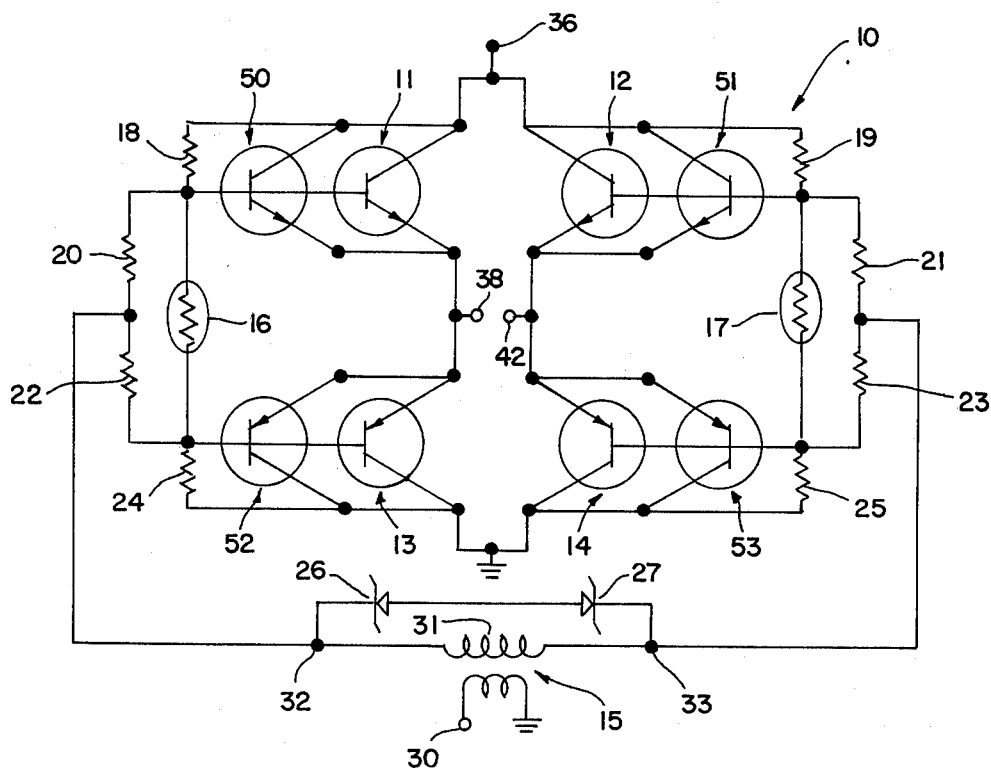

LINEAR SOUND AMPLIFIER CIRCUIT

This is a continuation of application Ser. No. 690,329, filed Dec. 12, 1975, now abandoned.

BACKGROUND OF THE INVENTION

1. Field of the Invention

This invention relates to a linear sound amplifier circuit for increasing the output power of stereophonic tape or record players.

2. Description of the Prior Art

Many systems are described in previous art or are available in the marketplace to amplify high fidelity signals received from stereophonic tape or record players, but these generally consist either of simple and relatively low output circuits built integrally in the tape or record player mechanism or of needlessly complex circuits that are generally complicated and expensive to manufacture. Additionally, available amplification systems typically do not use a balanced bridge configuration but are provided in a single ended configuration so that there is generally crossover distortion and a signal provided by the bias current is continually present through the circuit mode. There is obviously a need for a Class A linear amplifier using a balanced bridge configuration for more effectively increasing output power from stereo tape or record players, with the output being provided without distortion and with the idle bias currents being cancelled when no signal is being fed through the circuit.

SUMMARY OF THE INVENTION

The present invention provides a novel linear sound amplifier circuit specifically of the class AB type for increasing the fidelity and output of stero tape or record players with a minimal amount of distortion by use of a balanced bridge amplifier for effectively doubling or quadrupling the output power.

It is a feature of the present invention to provide a linear sound amplifier circuit of the class B or AB type for stereo record or tape players.

A further feature of the present invention provides a linear sound amplifier circuit which is reliable and efficient in operation.

Yet still a further feature of the present invention provides a Class A linear sound amplifier circuit which can be economically produced and which, therefore, may be marketed by the manufacturer at a competitive price.

Other features of this invention will be apparent during the course of the following description.

BRIEF DESCRIPTION OF THE DRAWINGS

In the accompanying drawings forming a part of this specification, and in which like reference characters are employed to designate like components throughout the same:

FIG. 1 is a schematic diagram of the linear sound amplifier circuit using two complementary pairs of transistors; and FIG. 2 is a schematic diagram of the linear sound amplifier circuit using eight transistors.

DESCRIPTION OF THE PREFERRED EMBODIMENT

Referring now to the drawings in detail, there is illustrated a preferred form of the linear sound amplifier circuit schematically drawn in accordance with the principles of the present invention and which is designated generally in its entirety by the reference numeral 10 and which is comprised of NPN transistors 11 and 12, PNP transistors 13 and 14, a transformer 15, thermistors 16 and 17, resistors 18, 19, 20, 21, 22, 23, 24, and 25, Zener diodes 26 and 27, and associated connections between the components as will be later described.

Typical values proposed for the resistors and thermistors are, but are not limited to, the following:

| Component | Value |
| --- | --- |
| Resistors 18 and 19 | 1.5K ohms |
| Resistors 20 and 21 | 330 ohms |
| Resistors 22 and 23 | 330 ohms |
| Resistors 24 and 25 | 1.5K ohms |
| Thermistors 16 and 17 | 800 ohms (cold) |

In operation, the input signal from the stereophonic playing device is applied to transformer 15 at its primary 30, the primary winding 30 of transformer 15 having a resistance of 8 ohms to match the resistance of the input device. The signal is then stepped up at the secondary 31 of transformer 15, the secondary winding 31 having the resistance of approximately 500 ohms, from whence the signal is applied to the bases of each of the complementary pairs of transistors 11, 13 and 12, 14 through the center of the resistive divider network defined by resistors 20 through 23. The Zener diodes 26 and 27 are connected in series across the secondary winding 31 of the transformer 15 to limit the input signal to the value of the breakdown voltages of Zener diodes 26 and 27 and of the base emitter junctions of the transistors 11 to 14. Transformer 15 also functions to isolate the output stage of the preceding amplifier in the stereo player device from the linear sound amplifier circuit 10, and to match the impedance from the preceding stage to the amplifier circuit 10.

When a positive signal appears at the secondary 31 of transformer 15 at terminal 32, then a negative signal will simultaneously appear at the secondary 31 of transformer 15 at terminal 33. The positive going signal at the terminal 32 will be transmitted to the base 44 of transistor 11 through resistor 20 and to the base 35 of transistor 13 through resistor 22. A DC bias (+12 to 14 volts) is applied to terminal 36, such as from an automotive battery, to maintain transistor 11 to be idling in its linear region, so that a positive signal at the base 34 of the transistor 11 will drive it further into conduction, causing current from its emitter 37 to increase approximately to the beta of the transistor multiplied by the change in base current, thereby in turn causing a positive going increase in current across the load at terminal 38 for transmission of the signal to subsequent speakers or other resistive load. The positive going input signal at terminal 32 of the secondary 31 of transformer 15 is also transmitted to the base 35 of transistor 13 through resistor 22, this effectively biasing transister 13 into its cutoff region so that no signal is transmitted through it. The negative going input signal at terminal 33 of the secondary 31 of transformer 15 is simultaneously transmitted to the base 39 of transistor 12 through resistor 21 and the base 40 of transistor 14 through resistor 23. A negative going signal at the base 39 of transistor 12 will effectively drive it into cutoff, so that no signal is transmitted therethrough, with a negative going signal at the base 40 of transistor 14 driving it further into conduction (transistor 14 is idling in its linear region due to the DC bias applied at terminal 36). The absolute value of the current from the emitter 41 of transistor 14 will increase by approximately the beta of the transistor multiplied by the change in base current, this causing a negative going increase in current amplification across the load at terminal 42. The combined positive going increase in current at terminal 38 from transistor 11 and the negative increase in current at terminal 42 from the transistor 14 causes a current doubling across the load or a quadrupling in output power. This is derived from the relation, $P = I^2R$, for a single ended configuration; and substituting 2I for I in a balanced bridge, then $P = (2I)^2R = 4I^2R$ or a fourfold increase in power.

The above operation applies for a negative going input signal at terminal 32 of the secondary 31 of transformer 15 and the simultaneous positive going input signal at terminal 33 of the secondary 31 of transformer 15 except that, in this instance, transistors 12 and 13 conduct and transistors 11 and 14 are cut off.

As shown is FIG. 2, the effective power output of the linear sound amplifier circuit 10 in FIG. 1 can be doubled by adding transistors 50 through 53 in parallel with transistors 11 through 14 respectively. The preceeding discussion concerning the circuitry operation would apply whether using eight transistors or four transistors, except that the incoming signal would be applied simultaneously to the bases of the two transistors rather than to the base of a single transistor. Since the amplification caused by 2 transistors would be double that of a single transistor, the effective output of the amplifier circuitry would be doubled.

There is thus described a novel Class B linear sound amplifier circuit for use in conjunction with stereophonic tape or record players for doubling or quadrupling the output of the stereo player without distortion. The circuitry described can be utilized within the existing cabinetry of stereophonic tape or record players or it can be provided in a separate unit which can be interconnected between an existing player unit and the audio speakers.

It is to be understood that the form of this invention as shown and described is to be taken as a preferred example thereof, and that this invention is not to be limited to the exact arrangement of parts described in the description or illustrated in the drawings as changes thereto pertaining to size, shape and arrangement of parts thereof are envisioned within the scope of the invention without departing from the novel concepts of the invention.

Having thus described the invention, what is claimed is:

1. A linear sound amplifier circuit for increasing fidelity and boosting power output from a sound source in the form of a stereophonic tape or record player and the like, the circuitry comprising in combination:

a balanced bridge network including a series of NPN transistors and PNP transistors, the collectors of each PNP transistor connected to ground, and the emitter of a first NPN transistor connected directly to the emitter of a first PNP transistor to form one segment of said balanced bridge network and the emitter of a second NPN transistor directly connected to the emitter of the second PNP transistor to form the second segment of said balanced bridge network;

a resistive divider network at the power input of each segment of said balanced bridge network, the base of each said NPN transistor connected to the base of each said transistor in each segment by means of said resistor divider network;

a transformer having a primary winding connected to the input signal from said sound source, a secondary winding having opposite terminals with each terminal connected to the center of each resistive divider network connecting the bases of said transistors in each segment of said balanced bridge network, the secondary winding of said transformer including limiting means for limiting the input signals applied by said terminals to the center of each resistive divider network to a predetermined breakdown voltage value;

a DC voltage supply terminal adapted for connection to a DC voltage supply means with the collectors of each NPN transistor connected to said terminal; and a common output including a first output terminal connected to the emitters of said first NPN and PNP transistors and a second output terminal connected to said emitters of said second NPN and PNP transistors, said first and second output terminals providing the signal output for transmission thereof to a resistive load.

2. A linear sound amplifier circuit according to claim 1 in which said limiting means are defined by Zener diodes connected in series across said secondary winding of said transformer to limit the input signals to the value of the breakdown voltages of said Zener diodes.

3. A linear sound amplifier circuit according to claim 1 including a thermistor and a pair of resistors arranged in parallel in each of said resistive divider networks, and a resistor connected between the base of each NPN transistor and said DC voltage supply terminal.

* * * * *